United States Patent [19]

Dipietromaria

[11] 4,214,212
[45] Jul. 22, 1980

[54] TUNER DEVICE FOR A TELEVISION RECEIVER

[75] Inventor: Edoardo Dipietromaria, Turin, Italy

[73] Assignee: Indesit Industria Elettrodomestici Italiana S.p.A., Rivalta, Italy

[21] Appl. No.: 8,445

[22] Filed: Feb. 1, 1979

Related U.S. Application Data

[63] Continuation-in-part of Ser. No. 768,672, Feb. 14, 1977, abandoned.

[30] Foreign Application Priority Data

[IT] Italy .............................. 67773 A/76

[51] Int. Cl.² .............................................. H04B 1/26
[52] U.S. Cl. .................................. 455/190; 361/402; 361/422; 455/180
[58] Field of Search ............... 325/453, 458, 459, 460, 325/461, 464, 465, 468, 319, 414; 358/191; 334/15; 361/380, 395, 397, 400, 401, 402, 409, 422

[56] References Cited
U.S. PATENT DOCUMENTS

| 3,354,397 | 11/1967 | Wittig | 334/15 |
| 3,555,430 | 1/1971 | Fischer et al. | 325/459 |
| 3,624,554 | 11/1971 | Hilliker et al. | 334/15 |
| 3,659,205 | 4/1972 | Cooke et al. | 334/15 |
| 3,727,140 | 4/1973 | Nieto et al. | 325/459 |
| 3,794,924 | 2/1974 | Furuya et al. | 325/459 |
| 3,813,602 | 5/1974 | Van Dijum et al. | 325/319 |
| 3,818,349 | 6/1974 | Ma | 334/15 |
| 3,821,610 | 6/1974 | Harcombe | 334/15 |

Primary Examiner—Marc E. Bookbinder
Attorney, Agent, or Firm—Sughrue, Rothwell, Mion, Zinn and Macpeak

[57] ABSTRACT

A tuning device for a television receiver in which the electrical components are largely formed by thick film deposition techniques on a ceramic support plate. The tuning device includes a frequency converter which acts to convert the input frequency to the intermediate frequency of the receiver and which is fed by preceding filters and converter circuits only with UHF signals regardless of whether the receive is tuned to the VHF or the UHF wave band. This is achieved by means of high- and low-pass filters and a further converter circuit which converts VHF signals to UHF when energized to do so by an oscillator which is controlled to operate only when the VHF wave band is selected.

5 Claims, 5 Drawing Figures

TUNER DEVICE FOR A TELEVISION RECEIVER

CROSS REFERENCE TO RELATED APPLICATION

This application is a continuation-in-part of Ser. No. 768,672 filed Feb. 14, 1977 and now abandoned.

BACKGROUND OF THE INVENTION

The present invention relates to a tuner device for a television receiver and, more particularly, to a circuit for selection of the television channel it is desired to receive, and to a conversion circuit for converting the signal received, from the frequency of the selected channel to the fixed intermediate frequency at which the signal amplification circuits operate. The selection and conversion circuits together are generally known as a "tuner."

There are many types of "tuners" on the market which differ from each other with regard to the arrangement of the circuits, but all have in common the complexity of the construction, particularly with respect to the assembly of the components and the calibration of the finished circuit.

Moreover, it is necessary to bear in mind that the circuits in question deal with signals the frequencies of which may lie between 48 MHz of the lowest channel of the VHF band and 855 MHz of the highest UHF channel. At these frequencies the influence of component position or layout of components on the behavior of the circuits are no longer negligible. In fact, at high frequencies, the connections between the various separate components themselves present impedance values which cannot be neglected in the design of the circuit and nor can the parasitic capacitance of each circuit element. In addition, the values of these distributed elements also vary with the geometry of the circuits, therefore rendering their a priori determination difficult, and this also makes the repeatability of the values from one circuit to another difficult.

For this reason, at the design stage, it is necessary to allow an adequate margin on some component values to permit calibration of the finished circuits in order to obtain proper operation since, due to tolerances on the circuit components themselves, the finished circuit may well need to undergo considerable adjustment by way of calibration before it functions properly.

In order to reduce this effect, many designers have tended to reduce the length of the connections between individual components by mounting them very close to one another on a printed circuit board. However, this leads to other difficulties since the assembly of the individual components onto the board involves very delicate operations because of the proximity of the components to one another.

SUMMARY OF THE INVENTION

The present invention thus seeks to provide a tuning device for a television circuit which does not suffer from the above-mentioned disadvantages, which is easier and cheaper to manufacture than previously-known tuning devices and which performs entirely satisfactorily.

According to the present invention, there is provided a tuning device for a television receiver of the type comprising a first converter circuit which converts the frequency of the signal received into a lower frequency and a first oscillator circuit which supplies a signal for the conversion at the said converter, characterized in that the said first converter circuit is always fed with input signals at a frequency within the UHF wave band and in that at least some of the circuit elements of the said device are formed by means of the deposition of conductive material onto an insulating support.

BRIEF DESCRIPTION OF THE DRAWINGS

Embodiments of the present invention will now be more particularly described, by way of example, with reference to the accompanying drawings, in which.

DETAILED DESCRIPTION OF THE INVENTION

Figure 1:
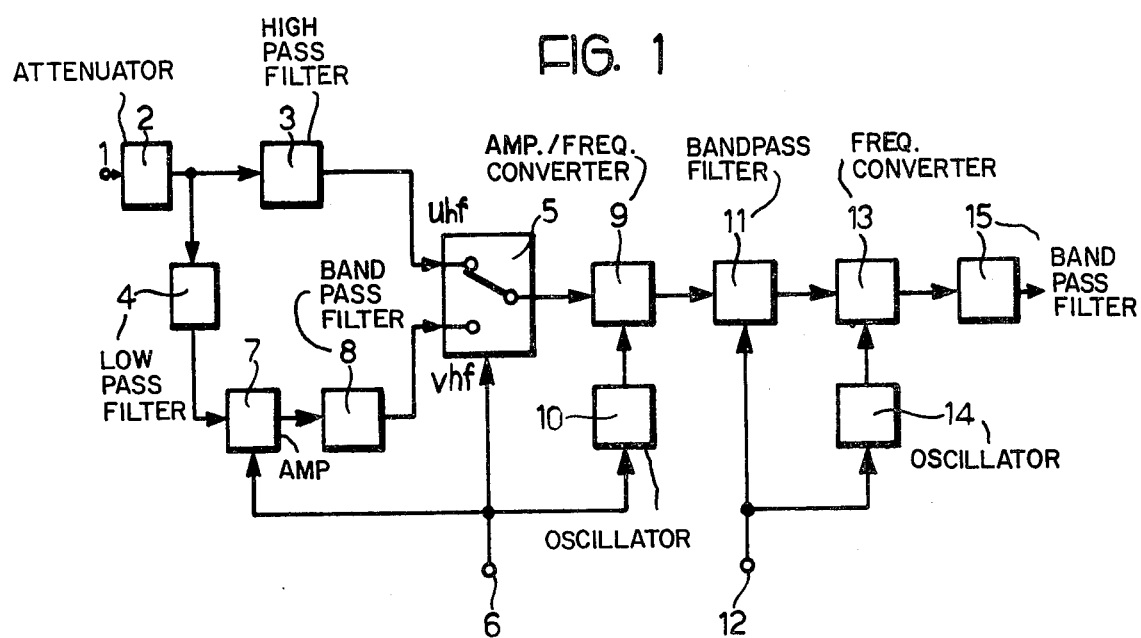
FIG. 1 is a block diagram of a tuning device formed as one embodiment of the present invention.

Referring now to the drawings, and particularly to FIG. 1, there is shown an input terminal 1 to which is applied the received television signal coming from the aerial circuits (not shown). The signals applied to terminal 1 have a wide frequency range between 48 MHz, which is the lowest frequency of channel 2 of the VHF wave band, and 855 MHz, which is the highest frequency of channel 69 of the UHF wave band.

Input terminal 1 is connected to an input of a controlled variable attenuation circuit 2, for example, incorporating PIN diodes, which is controlled by an automatic gain control signal from the video detection circuits and attenuates the signal at terminal 1 to a greater or lesser degree in dependence on this signal in order to maintain substantially constant the amplitude of the signal at the output of attenuator 2 so that it is independent of the amplitude of the received signal. The output of attenuation circuit 2 is connected to the input of a high-pass filter circuit 3 which passes the frequencies in the UHF wave band and also to a low-pass filter circuit 4 which passes the frequencies in the VHF wave band.

The output of filter circuit 3 is connected to a first input of a switch circuit 5 to which is fed a control signal 6 which controls the switch to adopt one position or the other in dependence on whether the receiver is to be tuned to a channel in the VHF or the UHF wave band. The output of filter circuit 4 is connected to the input of a wide-band amplifier circuit 7 which also receives control signal 6 which energizes or de-energizes it depending on whether the channel selected for reception falls within the VHF or the UHF wave band.

The output of amplifier 7 is connected to the input of a band-pass filter circuit 8 which allows only the signals in the VHF wave band to pass. The output of band-pass filter circuit 8 is connected to a second input of switch circuit 5. The output of switch circuit 5 is connected to a first input of a frequency converter circuit 9 which is also fed at a second input with a reference signal of fixed frequency $f_o$ from a fixed oscillator circuit 10 and acts to convert frequency $f_1$ of the input signal into a frequency $f_2$ which is the sum of frequency $f_1$ and frequency $f_o$.

Oscillator circuit 10 is also fed with control signal 6 which controls it to switch on or off in dependence on whether the channel selected for reception is a UHF or VHF channel. Converter circuit 9 is so designed that if it receives no signal from oscillator circuit 10, it will operate to supply at its output, amplified, the signal applied to its first input. A possible embodiment of circuit 9 will be given later.

The output of converter circuit 9 is connected to a first input of a band-pass filter circuit 11 which has a bandwidth sufficient to allow at least one television channel to pass. For this reason, band-pass filter circuit 11 is variable in frequency by means of a control signal 12 which is fed to a second input thereof so that by varying the tuning frequency, it is possible to tune filter 11 to pass any one of the channels of a given wave band. This control signal can, for example, simply be a voltage which is supplied to a varicap diode contained in filter 11 to vary its capacitance until filter circuit 11 is tuned to the frequency of the channel which it is desired to receive.

The output of circuit 11 is connected to a first input of a frequency converter circuit 13 which receives at a second input a signal from a variable oscillator circuit 14. Frequency converter circuit 23 converts the frequency of the input signal (for convenience referred to as frequency $f_3$) into an output frequency $f_4$ which is the difference between the frequency (indicated frequency $f_5$) of variable oscillator 14 and input signal $f_3$. Variable oscillator 14 is also fed with control signal 12 which controls it in such a way that frequency $f_5$ at its output is predetermined in dependence on the channel selected by the user and varies with frequency $f_3$ in such a way that frequency $f_4$ at the output of converter circuit 13 is always the same whatever the channel selected. Frequency $f_4$, which is the so-called intermediate frequency, may be, for example, 38.9 MHz (the frequency of the video carrier) which is the appropriate value for the Italian standard. The output of converter circuit 13 is, finally, connected to the input of a band-pass filter circuit 15 tuned to the intermediate frequency, which only allows the said frequency to pass and cuts out from the signal fed thereto any spurious frequencies which might be present. Naturally, filter circuits 11 and 15 have a bandwidth sufficient to allow the passage of a whole television channel. At the output of circuit 15 is, therefore, available the intermediate frequency signal in an appropriate form to be fed to the subsequent amplifier and detector stages of the receiver.

The circuit described with reference to FIG. 1 operates as follows: to terminal 1 is fed the signal received by the aerial circuits, and this signal is, therefore, constituted by a plurality of separate signals at different frequencies, each one representing the information transmitted on one television channel.

If it is desired to receive a channel within the UHF wave band, the appropriate controls are operated to cause control signal 6 to act on amplifier 7 to de-energize it, to act on switch circuit 5 to permit signals from filter circuit 3 to pass on to converter circuit 9 and to act on fixed oscillator 10 to switch it off so that no signals are fed to the second input of converter circuit 9.

The tuning knob is then operated to tune filter circuit 11 and variable frequency oscillator 14 by adjusting the value of control signal 12 to pass the desired IF signal to filter circuit 15.

A selected UHF signal, therefore, travels along the following path. It enters through terminal 1, is attenuated in amplitude by controlled attenuator circuit 2, is separated from the signals in the VHF wave band by high-pass filter circuit 3 and is routed through switch 5 to converter circuit 9 which, since oscillator 10 is switched off, merely amplifies it and feeds it to tuned band-pass filter circuit 11 which separates it from the other signals in the UHF band; it then passes to converter circuit 13 which converts it to the intermediate frequency and, finally, it passes through tuned filter circuit 15 and is made available to the following circuits of the television set.

If, on the other hand, the selected channel is in the VHF wave band, control signal 6 energizes amplifier 7, connects switch 5 to the appropriate state and energizes oscillator circuit 10. The selected signal, therefore, passes through attenuator circuit 2 to low-pass filter circuit 4 which separates it from the signals in the UHF wave band; from there, it passes through amplifier circuit 7 and filter circuit 8 and, via switch circuit 5, to converter circuit 9. Because frequency $f_o$ of oscillator circuit 10 is selected in such a manner that frequency $f_2$ at the output of converter circuit 9 lies within the frequency range of the UHF wave band, the following circuits operate in the same way as when a UHF channel is selected. In this way, the channels in the VHF wave band are converted to UHF frequencies upon selection, that is to say, a double conversion takes place during the VHF reception.

Figure 2:
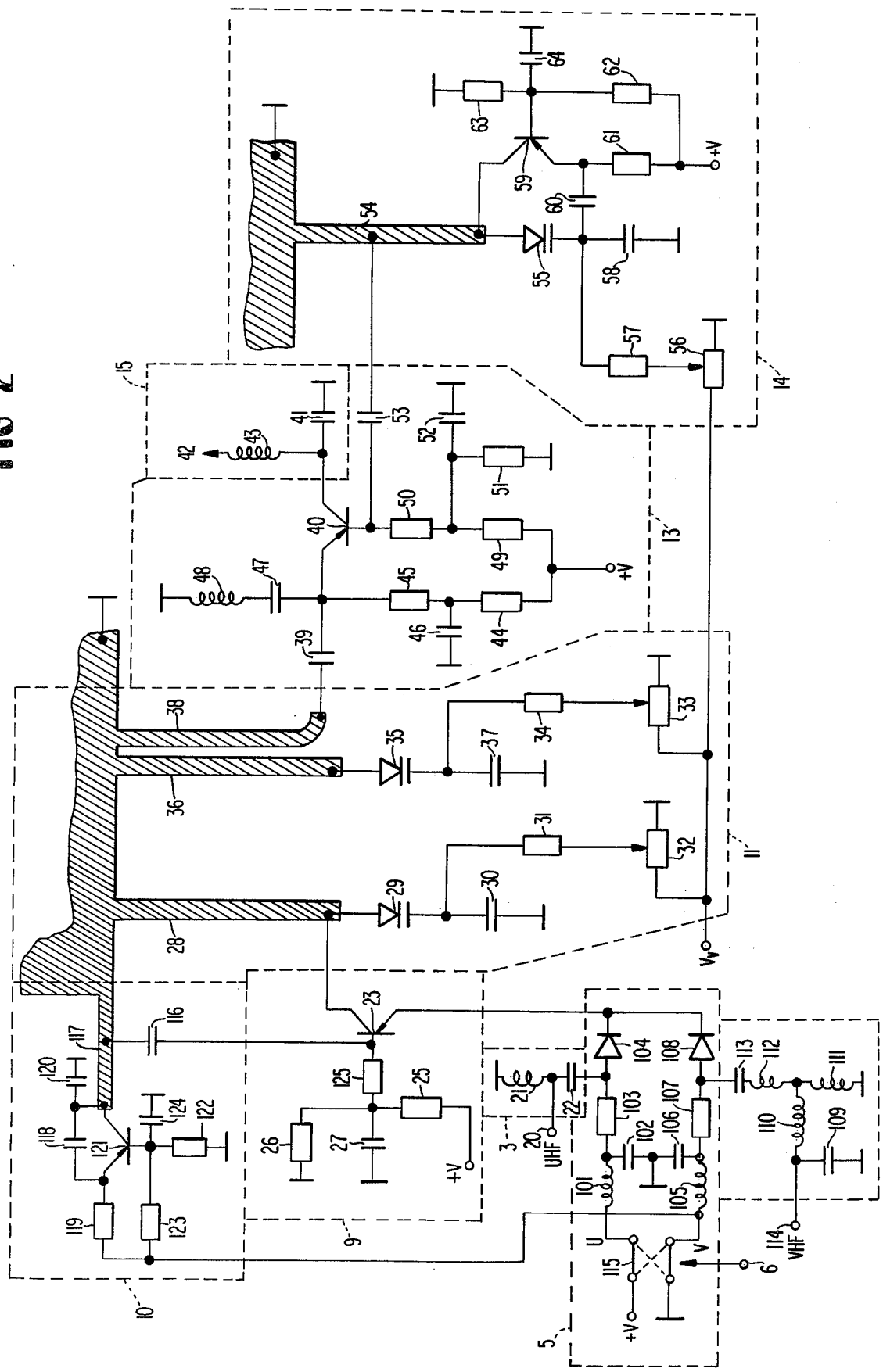
FIG. 2 is a circuit diagram illustrating in detail one part of the block schematic diagram shown in FIG. 1.

In FIG. 2, there is shown a practical embodiment for part of the circuit illustrated schematically in FIG. 1, that is, blocks 3, 5, 8–11, 13 and 14. Because the circuits of FIG. 2 operate at very high frequencies in order to obtain the required impedance values, it has been found necessary to use resonant lines.

Furthermore, in order to avoid known disadvantages consequent on wiring connections to independent components and in order to obtain close production tolerances, the position and the form of the resonant lines has been fixed by forming these as deposited conductive components on a printed circuit board.

In FIG. 2, there is shown an input terminal 20 corresponding to the input of circuit 3 shown in FIG. 1. To terminal 20 are connected a first terminal of an inductor 21, the other terminal of which is connected to earth, and a first terminal of a capacitor 22, the other terminal of which is connected to the anode of a diode 104, the cathode of which is connected to the emitter of a PNP transistor 23. The anode of diode 104 is connected to one terminal of a resistor 103, the second terminal of which is connected to earth through a capacitor 102 and to a terminal U of a switch 115 through an iductance 101.

To terminal 114 is connected one terminal of a capacitor 109, the second terminal of which is connected to earth, and one terminal of an inductance 110, the second terminal of which is connected to one terminal of inductances 111 and 112, respectively.

The second terminal of inductance 111 is connected to earth; the second terminal of inductance 112 is connected to one terminal of a capacitor 113, the other terminal of which is connected to the anode of a diode 108, the cathode of which is connected to the emitter of transistor 23.

The anode of diode 108 is connected to one terminal of a resistor 107, the second terminal of which is connected to earth through a capacitor 106 and to a terminal V of switch 115 through an inductance 105.

Switch 115 is driven by a drive 6 and has two other terminals connected to voltage +V and to earth, respectively, and is so disposed as to connect (at its first step) voltage +V to terminal U and earth to terminal V while it effects opposite connections in the second step.

Transistor 23 further receives the base polarization through a decoupling resistor 125 connected to voltage +V through a resistor 25 and to ground voltage through a parallel group formed by a resistor 26 and by a capacitor 27.

The base of transistor 23 is also connected to a terminal of a capacitor 116, the second terminal of which is connected to an intermediate point of a resonant line 117, one terminal of which is connected to the ground of the circuit and the other terminal of which is connected to earth through a tuning capacitor 120 to one terminal of a capacitor 118 and to the collector of a PNP transistor 121, respectively.

Transistor 121 receives the base polarization through a resistor 123 connected to terminal V and through the parallel group formed by resistor 122 and by capacitor 124.

The emitter of transistor 121 is connected to feeding terminal V through resistor 119 and to the second terminal of capacitor 118. The collector of transistor 23 is connected to earth through a resonant line 28 and also through a varicap diode 29 and a capacitor 30 in series. The cathode of diode 29 is connected to capacitor 30 and receives a biasing voltage through a resistor 31 and a potentiometer 32, which latter is connected between a voltage source $+V_y$ and earth, the wiper being connected to resistor 31.

To input voltage source $+V_y$ is also connected a second potentiometer 33, the wiper of which is connected through a resistor 34 to the cathode of a varicap diode 35, the anode of which is connected to earth through a resonant line 36. The cathode of varicap diode 35 is also connected to earth through a capacitor 37.

Resonant line 36 is coupled to a resonant line 38 which has one end connected to earth and another connected to one terminal of a capacitor 39, the other terminal which is connected to the emitter of a PNP transistor 40, the collector of which is connected to earth through a capacitor 41 and also to an output terminal 42 through an inductor 43. Output terminal 42 represents the output of converter circuit 13 shown in FIG. 1. The emitter of transistor 40 is biased from a voltage source +V through two resistors 44 and 45 in series. The junction point between the two resistors 44 and 45 is connected to earth through a capacitor 46. The emitter of transistor 40 is also connected to earth through a capacitor 47 and an inductor 48. The base of transistor 40 is biased by voltage source +V through two resistors 49 and 50 in series.

The junction between the two resistors 49 and 50 is earthed through a resistor 51 and a capacitor 52 in parallel. The base of transistor 40 is also connected through a capacitor 53 to a resonant line 54, one end of which is connected to earth, the other end of which is connected to the anode of a varicap diode 55 which receives a DC voltage on its cathode from input source $+V_y$ through a potentiometer 56 and a resistor 57.

The cathode of varicap diode 55 is earthed through a capacitor 58 and is also connected through a capacitor 60 to the emitter of a PNP transistor 59, the collector of which is connected to the anode of varicap diode 55. The emitter of transistor 59 is biased by voltage input source +V through a resistor 61, and the base is biased by source +V through a resistor 62. The base of transistor 59 is also connected to earth by a resistor 63 and a capacitor 64 in parallel.

The working of the circuit is described with reference also to FIG. 1; therefore, the elements belonging to blocks already indicated in FIG. 1 have been separated through a dotted line and indicated with the corresponding reference number.

The circuit described above operates as follows: A signal in a channel belonging to the UHF wave band enters from terminal 20. Capacitor 22 and inductor 21 together form a high-pass filter which acts to prevent unwanted signals in the VHF wave band from entering beyond terminal 20. A signal in the UHF wave band passed by the high-pass filter is fed to the emitter of amplifying stage 23 if there is fed to terminal U of the switch a positive voltage +V sufficient to cause signal switching diode 104 to conduct. Group 101 and 102 is a filter intended to stop the radio frequency, while resistor 103 has the purpose of decoupling source +V from the radio frequency signal and of determining the appropriate value of polarization current which must flow through diode 104 and through transistor 23.

When positive voltage +V is fed to terminal U, it is necessary to feed to terminal V a low voltage (ground voltage); in this way, through decoupling and polarizing components 105, 106 and 107, signal switching diode 108 is fed with a voltage sufficient to prevent it from conducting so that a VHF signal present on terminal 114 cannot reach the emitter of amplifying transistor 23. As already said, in this instance, transistor 23 works as a common-base amplifier in that it does not receive any signal to the base because transistor 121 and the oscillator shown by block 10 is not working.

On the contrary, if one feeds terminal V with a positive voltage and terminal U with a low voltage (switch 115 at second step), transistor 23 receives its polarization from a current depending upon the value of resistor 107, diode 108 conducts, diode 104 is stopped and only the VHF signal fed to terminal 114 may reach, through band-pass filters 109, 110, 111, 112 and 113, the emitter of transistor 23.

At the same time, transistor 121 is fed with voltage +V existing at terminal V and produces an oscillation having a frequency substantially determined by the circuit formed by line 117 and by capacitor 120 as a consequence of the positive reaction introduced by capacitor 118.

One portion of the signal existing at the collector of transistor 121 is taken by means of the derivation on resonant line 117 and fed through capacitor 116 to the base of transistor 23 which, therefore, works as mixer, as is the case with transistor 40.

The UHF signal or the VHF signal converted as above is found on the collector of transistor 23 which has, as a load impedance, resonant line 28 tuned to the capacitance presented by varicap diode 29 and capacitor 30 for the purpose of selecting only the required television channel.

The length of resonant line 28 is less than λ/4 for the maximum frequency to be dealt with so that the resonant line always has an inductive value for any frequency within the UHF wave band. By varying the value of the biasing voltage supplied to varicap diode 29 by resistor 31 and potentiometer 32, the tuning of the series resonant circuit formed by resonant line 28, varicap diode 29 and capacitor 30 is adjusted. The signal from the collector of transistor 23 is coupled electromagnetically through resonant line 28 with adjacent resonant line 36, which latter forms with varicap diode 35 and capacitor 37 a second resonant circuit in a manner entirely identical to that of the first mentioned resonant circuit.

The function of this second resonant circuit is to improve the selectivity of the device; and through resonant line 38, which is closely coupled to resonant line 36, the signal reaches the emitter of transistor 40 which functions as a frequency converter circuit since the base of transistor 40 is fed with a signal produced by the oscillator circuit formed by transistor 59 and components associated therewith. Thus, at the collector of transistor 40, there is available the received signal converted to the intermediate frequency.

The circuit formed by inductor 48 and capacitor 47 is damped series resonant circuit tuned to 36 MHz which, acting like a trap, prevents the transmission back through the aerial of the television (not shown) of the intermediate frequency and which also increases the conversion gain.

Inductor 43 and capacitor 41 together form a low-pass filter which selects only the intermediate frequency from the frequencies present on the collector of transistor 40 as a result of the conversion effected by transistor 40.

The frequency of the osciallator formed by transistor 59 is varied in dependence on the variation of the tuning frequency to which are tuned the two resonant circuits formed by resonant line 28, varicap diode 29 and capacitor 30, and by resonant line 36, varicap diode 35 and capacitor 37. For this purpose, the voltage which controls the capacitance of varicap diodes 29, 35 and 55 is simultaneously supplied to all three.

There is given below a table which lists the values of some components of the circuit described which were used in an experimental embodiment which has proved to operate successfully.

| 21 inductor | 0.1 μH |
| --- | --- |
| 22 capacitor | 6.8 pF |
| 23 transistor | BF 479 |
| 24 resistor | 680 Ω |
| 25 resistor | 5.6 K Ω |
| 26 resistor | 5.6 K Ω |
| 27 capacitor | 27 pF |
| 28 line | $Z_0 = 50$ Ω |
| 29 varicap diode | BB 105 B |
| 30 capacitor | 22 pF |
| 31 resistor | 39 K Ω |
| 32 potentiometer | 470 K Ω |
| 33 potentiometer | 470 K Ω |
| 34 resistor | 39 K Ω |
| 35 varicap diode | BB 105 B |
| 36 line | $Z_0 = 50$ Ω |
| 37 capacitor | 22 pF |
| 39 capacitor | 15 pF |
| 40 transistor | BF 479 |
| 41 capacitor | 4.7 pF |
| 43 inductor | 0.15 μH |
| 44 resistor | 330 Ω |
| 45 resistor | 68 Ω |
| 46 capacitor | 820 pF |
| 47 capacitor | 100 pF |
| 48 inductor | 0.2 μH |
| 49 resistor | 330 Ω |
| 50 resistor | 68 Ω |
| 51 resistor | 1.2 K Ω |
| 52 capacitor | 820 pF |
| 53 capacitor | 15 pF |
| 54 line | $Z_0 = 50$ Ω |
| 55 varicap diode | BB 105 B |
| 56 potentiometer | 470 K Ω |
| 57 resistor | 39 K Ω |
| 58 capacitor | 15 pF |
| 59 transistor | BF 479 |
| 60 capacitor | 2.7 pF |
| 61 resistor | 680 Ω |
| 62 resistor | 5.6 K Ω |
| 63 resistor | 5.6 K Ω |
| 64 capacitor | 120 pF |

Figure 3:
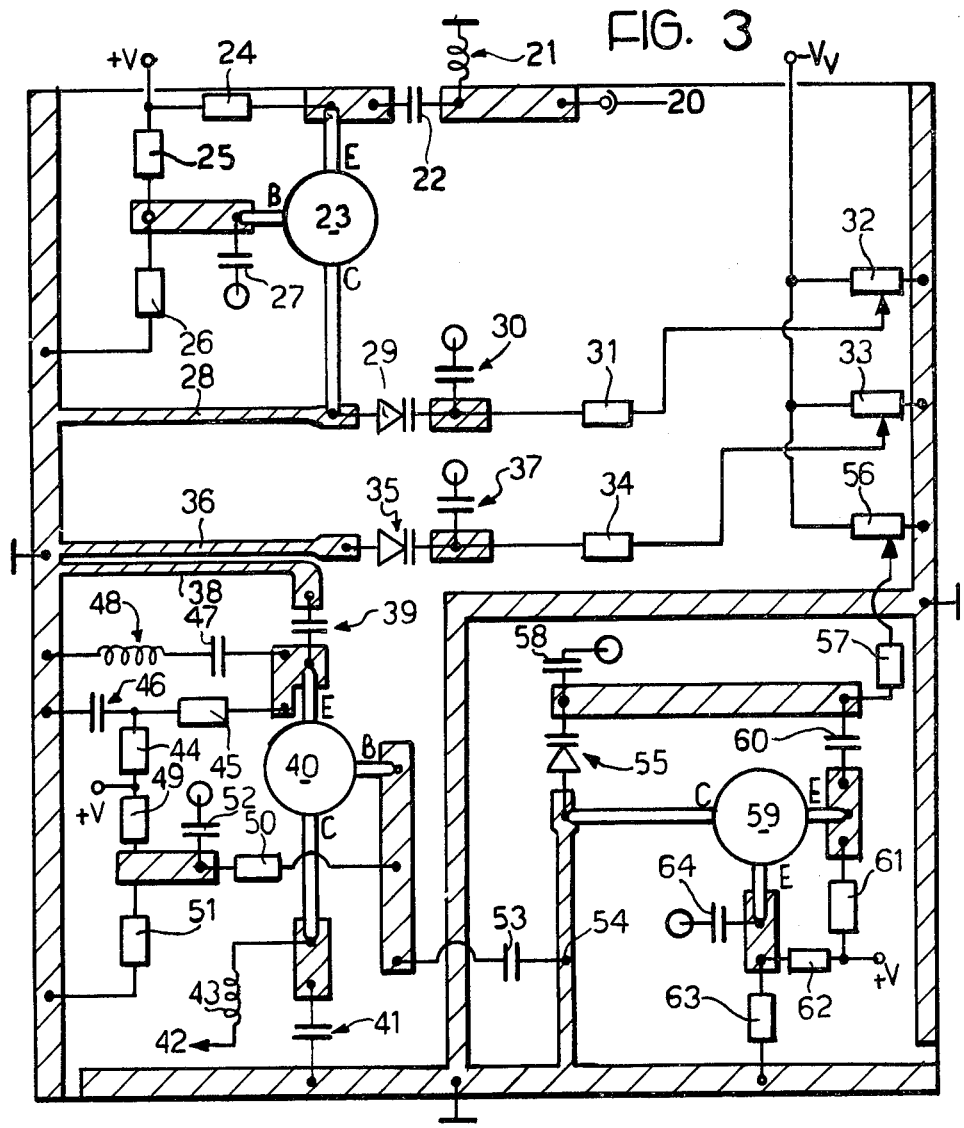
FIG. 3 illustrates the geometric arrangement of the connections and the components schematically shown in FIG. 2 illustrating one possible embodiment.

In FIG. 3, in which like reference numerals indicate the same components as in FIG. 2, there is illustrated the physical aspect of some of the components indicated in FIG. 2, whilst others are shown schematically.

In order to understand the significance of some of the solutions adopted in the design of the tuning device of the present invention (this also applies to FIGS. 4 and 5), it must be appreciated that for the purpose of eliminating the known disadvantages due to the difficulty of overcoming the distributed parameters, it has been sought to produce as many as possible of the components of the circuit by stamping or by deposition.

Thus, the resonant lines and the connections have been suppressed by stamping, and the resistors and the capacitors have been produced by means of the technique of thick film layer deposition on the same support as the resonant lines and the connections. A ceramic support is used to support the whole circuit; such a support has optimum characteristics both from the electrical point of view and from the point of view of resistance to the thermal stresses which occur, particularly during the deposition of the resistors.

Figure 4:
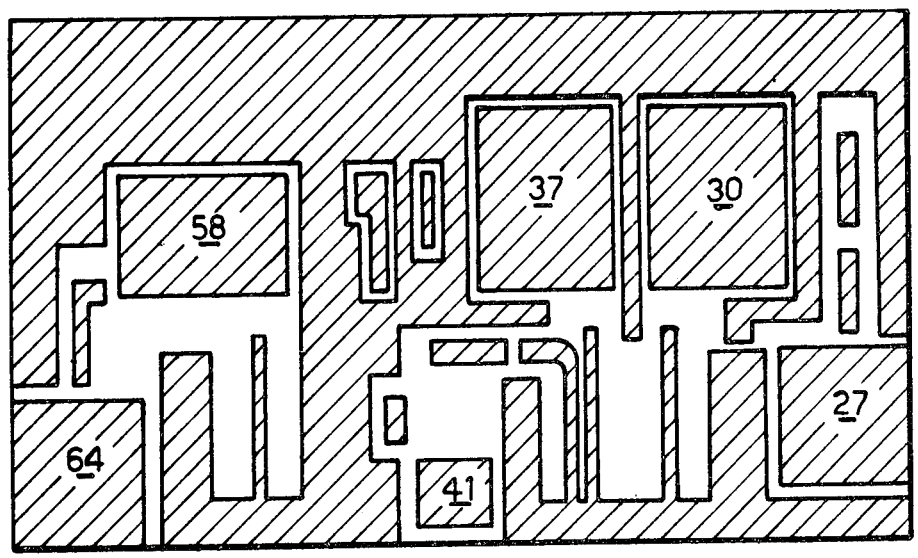
FIG. 4 is a further illustration of the geometric arrangement of some of the components schematically shown in FIG. 3.

FIG. 3 shows the general arrangement of the resonant lines and the circuits which are the most critical from the design aspect. Also in FIG. 3 are indicated schematically the resistors and the capacitors: the arrangement of these components is generally less critical than the arrangement of the other components and can be effected in many ways which do not substantially differ in terms of results. FIG. 4 shows one of the many possible solutions for the deposition of some of the capacitors shown in FIGS. 2 and 3.

The resonant lines illustrated in FIG. 3 are of the "strip line" type, that is to say, they are lines formed of a conductor printed on a plate of insulating material, and on the other side of the insulating material, a conducting material is provided over the whole surface of the plate. The electrical characteristics are, therefore, dependent on the electromagnetic field which forms between the upper strip line and the conductor on the opposite face of the insulating support plate.

The actual dimensions of, for example, resonant line 28 shown in FIG. 3 are: length—15 mm. and width—0.7 mm.

The holes indicated in FIG. 3 serve for the coupling of the terminals of some of the components with the lower conducting layer of the insulating support plate. With regard to the deposition of the resistors, these may be formed by techniques commonly used in the "thick film" field, and calibration may be effected by means of a laser or by one of the other known systems; such calibration techniques are all known in the art and will not be described in greater detail herein. It should be noted that if a laser is available for the calibration to a selected value of all those resistors formed by means of the "thick film" technique, it is possible to replace the three potentiometers 32, 33 and 56 by three resistors and then calibrate these by means of the laser during the inspection and testing of the finished circuit in such a way as to obtain the required production values. Thus, the tuner can be calibrated by adjusting well-defined parameters and without requiring the adjustment of parameters such as the inductance of small coils which are difficult to determine. It is also possible to make the whole calibration process automatic.

The capacitors of the circuit can be deposited by one of two different methods. One method relies on the use of the ceramic material of the support as a dielectric. The other method involves the provision of a separate dielectric which is also deposited onto the support plate. The first method has the advantage that it is possible to eliminate some of the connections between the plates of the capacitors and the remaining components of the circuit. In this way, the number of elements which are difficult to control at the design stage are reduced and, consequently, the tolerances of the assembly are reduced.

For example, if the capacitors which have an earthed plate are deposited directly onto the ceramic support plate and if the conducting layer on the other face of the ceramic support plate (which is earthed) is used as a second plate, the earth connections of the capacitors are eliminated with considerable advantage. This arrangement, however, has the disadvantage that such capacitors can occupy a considerable area of the support plate because the relative dielectric constant $\epsilon_r$ of the ceramic is 9 so that capacitors formed on a ceramic plate having a thickness of 0.6 mm. have a capacitance of 13.3 $pF/cm^2$. If, instead, both the two plates and the dielectric of a capacitor are deposited onto the ceramic support, it is possible to obtain therein layers of dielectric with a consequent increase of the capacitance/$cm^2$ which can be obtained, thereby saving the space occupied by capacitors. In this case, it is necessary carefully to study the paths of the connections and to provide holes in the ceramic support through which to connect the appropriate plates of the capacitors to earth. FIG. 4 illustrates an example of a compromise between the two aforementioned methods of obtaining capacitors. Only the capacitors which are the most critical from the point of view of the connections, that is, those indicated in FIG. 2 by numerals 27, 30, 37, 41, 58 and 64, have been deposited using the ceramic support as a dielectric. The remaining capacitors can then be provided by depositing both the plates and the dielectric onto a ceramic support. In this manner, an optimum solution is achieved inasmuch as the space occupied by capacitors is reduced to some extent whilst the more critical connections are avoided.

Figure 5:
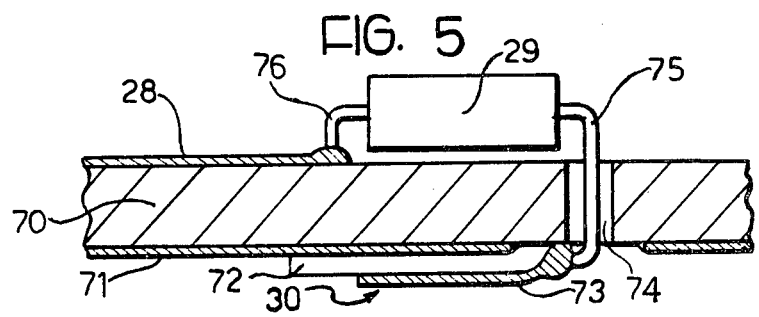
FIG. 5 illustrates a construction detail of the tuner device of the present invention.

A further arrangement which can be used in designing the deposition of the capacitors and the geometry of the connections is shown in FIG. 5. In this figure, reference numeral 70 indicates the thickness of the ceramic plate seen in section; the conductive strip of resonant line 28 is also seen in section, as are varicap diode 29 and capacitor 30. Capacitor 30 is constituted by a plate 71 which is the lower conductive layer printed on support 70, a dielectric layer 72 which is deposited onto lower conductive layer 71, and a conductive layer 73 which is deposited onto dielectric layer 72. A hole 74 passes through the whole assembly to permit connection between varicap diode 29 and capacitor 30. The two terminals of varicap diode 29 are indicated by reference numerals 75 and 76. This arrangement has the advantage of making it possible to form the capacitors which are earthed with only two deposition operations (that of dielectric layer 72 and that of conductive layer 73 forming the plate), thereby avoiding the necessity to make separate connections between the capacitor plates and earth. It also has the advantage that the capacitors have relatively small areas and that varicap diode 29 is finitely located by means of hole 74, thereby avoiding misplacement of the varicap diode with respect to its designed position during assembly. In this manner, the production tolerances are eased and calibrations are made easier.

It should be noted that, thanks to the rigid control of the arrangement of the components and to the great reduction in the length of the connections between components, variations from the designed values of the circuit are very much reduced; in fact, to a first approximation, the major contribution made to such variations in the manufactured circuits can be attributed to variations in the characteristics of the varicap diodes. For this reason, the three varicap diodes used are selected before being assembled for the purpose of choosing three which possess the most similar characteristics possible. Furthermore, residual differences in their behavior are further reduced by calibrating the three potentiometers 32, 33 and 56 with the circuit operating in its most critical condition, that is, when adjusted for the reception of the highest channel, when the capacitance of the varicap diodes must be at its minimum and, therefore, when the difference between the capacitance of each varicap diode and the parasitic capacitance is greatest.

From the above description, the advantages of the circuit arrangement according to the invention are evidenced, particularly in the simplicity of calibration. In fact, with respect to the number of calibration operations required by a tuner device of conventional construction (which is usually in the region of seven or eight), the device of the present invention only require three. A further advantage lies in the use of printed lines of conductive material on a substrate having a high dielectric constant. In fact, the use of the above-mentioned lines of conductive material, apart from representing an advantage from the constructional point of view, is also convenient inasmuch as it reduces the radiation of interference signals.

This improvement is possible because the electromagnetic field induced by the currents flowing in the printed conductive lines is largely confined in a material having a high dielectric constant and not in air.

It will be apparent to those skilled in the art that numerous variations from the above-described particular embodiment are possible without, however, departing from the scope of the present invention as defined in the appended claims. Amongst other possible variations, an oscillator which has a variable frequency could be used instead of oscillator 10. The switching of the frequency of this oscillator should occur when the circuit is operating in the VHF wave band, passing from the reception of a signal in band I to the reception of a signal in band III. Likewise, the tuning frequency of filter 8 could be switched for the purpose of improving the signal-to-noise ratio. A further possible variation is that of making the frequency of oscillator 10 continuously variable for the purpose of tuning to the VHF channels by adjusting the frequency of oscillator 10 and keeping that of oscillator 14 fixed.

What is claimed is:

1. A signal tuning device for a television receiver, including an intermediate frequency amplifier for receiving, selecting, amplifying ad converting to the intermediate frequency of the television receiver signals belonging to both the VHF and UHF ranges; said device including a first section for receiving and amplifying signals belonging to the UHF range and converting them to said intermediate frequency; said first section including first circuit means for amplifying UHF signals and converting signals belonging to the VHF range into signals belonging to the UHF range, and second circuit means for supplying a first local signal and mixing said first local signal with the amplified UHF signals from said first circuit means so as to convert them to said intermediate frequency for application to said IF amplifier; said first section including a plurality of circuit elements being formed by means of the deposition of conductive or resistive material onto a support made of insulating material; said plurality of circuit elements including resonant lines, conductive circuit elements, resistive circuit elements, inductive circuit elements and capacitive circuit elements; said device further including a second section for receiving and amplifying signals belonging to the VHF range and for generating a second local signal and supplying said amplified VHF signals and said second local signal to said first circuit means of said first section; said first circuit means mixing said second local signal and said amplified VHF signals to convert them into signals to the UHF range.

2. A signal tuning device according to claim 1 whereby said support made of insulating material is manufactured in the form of a plate, and one of the faces of said plate is nearly fully coated with a layer of conducting material; on the opposite face of said plate being directly deposited within defined areas is further conductive material to form said resonant lines and at least one plate of a condenser, the second plate of which is the conductive layer deposited upon said first face.

3. A signal tuning device according to claim 1 whereby said support made of insulating material is manufactured in the form of a plate, and one of the faces of said plate is nearly fully coated with a layer of conductive material; upon said layer being deposited within a defined area is a layer of dielectric material, upon which is deposited a second layer of conductive material, to said second layer being welded a terminal of an electrical circuit element mounted on the opposite face of the insulating support, said terminal passing through said support by means of a hole worked therein.

4. A signal tuning device according to claim 2 whereby said condenser is connected to a terminal of a varactor diode, the second terminal of which is connected to one of the resonant lines.

5. A signal tuning device according to claim 3 whereby said electrical circuit element is a varactor diode.

* * * * *